United States Patent [19]
Mast

[11] Patent Number: 5,004,867
[45] Date of Patent: * Apr. 2, 1991

[54] PERSONAL COMPUTER EXPANSION SLOT SEAL AND METHOD

[75] Inventor: Thomas R. Mast, Austin, Tex.

[73] Assignee: Compuadd Corporation, Dallas, Tex.

[ * ] Notice: The portion of the term of this patent subsequent to Oct. 24, 2006 has been disclaimed.

[21] Appl. No.: 356,689

[22] Filed: May 25, 1989

Related U.S. Application Data

[63] Continuation of Ser. No. 270,266, Nov. 14, 1988, Pat. No. 4,873,395.

[51] Int. Cl.$^5$ ............................................. H05K 9/00
[52] U.S. Cl. .............................................. 174/35 GC
[58] Field of Search ..................... 174/35 GC, 35 R; 361/424; 365/53

[56] References Cited
U.S. PATENT DOCUMENTS

| | | | |
|---|---|---|---|
| 1,765,443 | 6/1930 | Peterson | 174/35 GC |
| 3,277,230 | 10/1966 | Stickney | 174/35 GC |
| 4,744,006 | 5/1988 | Duffield | 361/424 X |

Primary Examiner—Leo P. Picard
Assistant Examiner—David A. Tone
Attorney, Agent, or Firm—Baker & Botts

[57] ABSTRACT

A personal computer CPU chassis (10) is sealed from the emission of radio frequency (RF) through the expansion slots (24) in the rear panel (18). An expansion slot seal (37) is dimensioned to fit over the edges or strips (32-34) of the slots (24) and is held in place by a slot cover (26). The seal (37) has a flat portion (46) for direct contact with the strips (32-34) and an angled portion (48) for direct contact with the cover (26). The cover (26) is held in place by a screw (54) and a retaining device (60) which forces the cover (26) into the seal (37). Thus a metal-to-metal seal is formed around the expansion slots (24) to inhibit the emission of RF therefrom.

7 Claims, 3 Drawing Sheets

## PERSONAL COMPUTER EXPANSION SLOT SEAL AND METHOD

RELATED APPLICATION

This is a continuation application of application Ser. No. 07/270,266, filed Nov. 14, 1988 and entitled "Personal Computer Expansion Slot Seal and Method", now U.S. Pat. No. 4,873,395, issued Oct. 10, 1989.

TECHNICAL FIELD OF THE INVENTION

This invention relates in general to the chassis of an electronic device, and in particular to a personal computer chassis expansion slot seal and method.

BACKGROUND OF THE INVENTION

A personal computer central processing unit (CPU) is an assemblage of electronic and solid state semiconductors in an arrangement of components and subcomponents. The functioning of the electronic components within the CPU generates high frequencies which result in the emission of radio frequency (RF) electromagnetic radiation therefrom. In response, the Federal Communications Commission (FCC) has created standards which limit the amount of allowable radio frequency to be emitted from electronic devices. It has been found that any openings in the enclosure surrounding the electronic components of the CPU (or any other electronic device) allow the escape of radio frequency. Therefore, in order to reduce RF emission and to meet FCC guidelines, it is necessary to close and seal any openings as best as practicable.

One source of escaping RF in prior computer enclosures is the expansion slot area generally located in the rear panel of a CPU. An expansion slot allows the interconnection of computer enhancing components to peripheral items. A circuit card may be interconnected by a cable through the expansion slot to other electronic components, such as a keyboard, a printer, or a monitor. To control RF emissions, it is necessary to seal the area around an expansion slot that is being used, as well as to cover and seal an expansion slot that is not being currently used.

One typical approach to containing RF in CPU enclosures has been to place a slot cover over any unused expansion slots and to secure the cover in place with screw(s).

However, as a result of mismatches between the edges of the expansion slot and the expansion slot cover, unacceptable levels of RF are sometimes allowed to escape. Thus, there is a need for a method and apparatus to more effectively seal the expansion slots of a CPU to retard the escape of RF.

SUMMARY OF THE INVENTION

The present invention disclosed herein comprises a method and apparatus for sealing an expansion slot in a personal computer which substantially reduces or eliminates problems associated with the poor fit of prior expansion slot covers. The present invention retards the emission of radio frequency from a personal computer central processing unit by minimizing gaps in the expansion slot area.

In accordance with one aspect of the present invention, an apparatus retards the escape of radio frequency from a personal computer central processing unit. At least one expansion slot is fixed to a computer chassis for future expansion of computer capabilities. An expansion slot cover is dimensioned to fit over and close the expansion slot when it is not being used. An expansion slot seal is dimensioned to fit between the slot cover and the edges of the expansion slot to retard the escape of radio frequency from the chassis.

In accordance with another aspect of the present invention, the seal comprises a resilient electrical conductor. The electrical conductor is preferably corrosion-resistant and may comprise, for example, stainless steel. The seal has a flat portion for direct contact with an edge of the expansion slot and an angled portion for contact with the slot cover.

It is a technical advantage of the present invention that the escape of radio frequency is retarded by the use of a seal between an expansion slot and an expansion slot cover.

BRIEF DESCRIPTION OF THE DRAWINGS

For a more complete understanding of the present invention and for further advantages thereof, reference is now made to the following Detailed Description, taken in conjunction with the accompanying Drawings, in which.

DETAILED DESCRIPTION OF THE INVENTION

Figure 1:
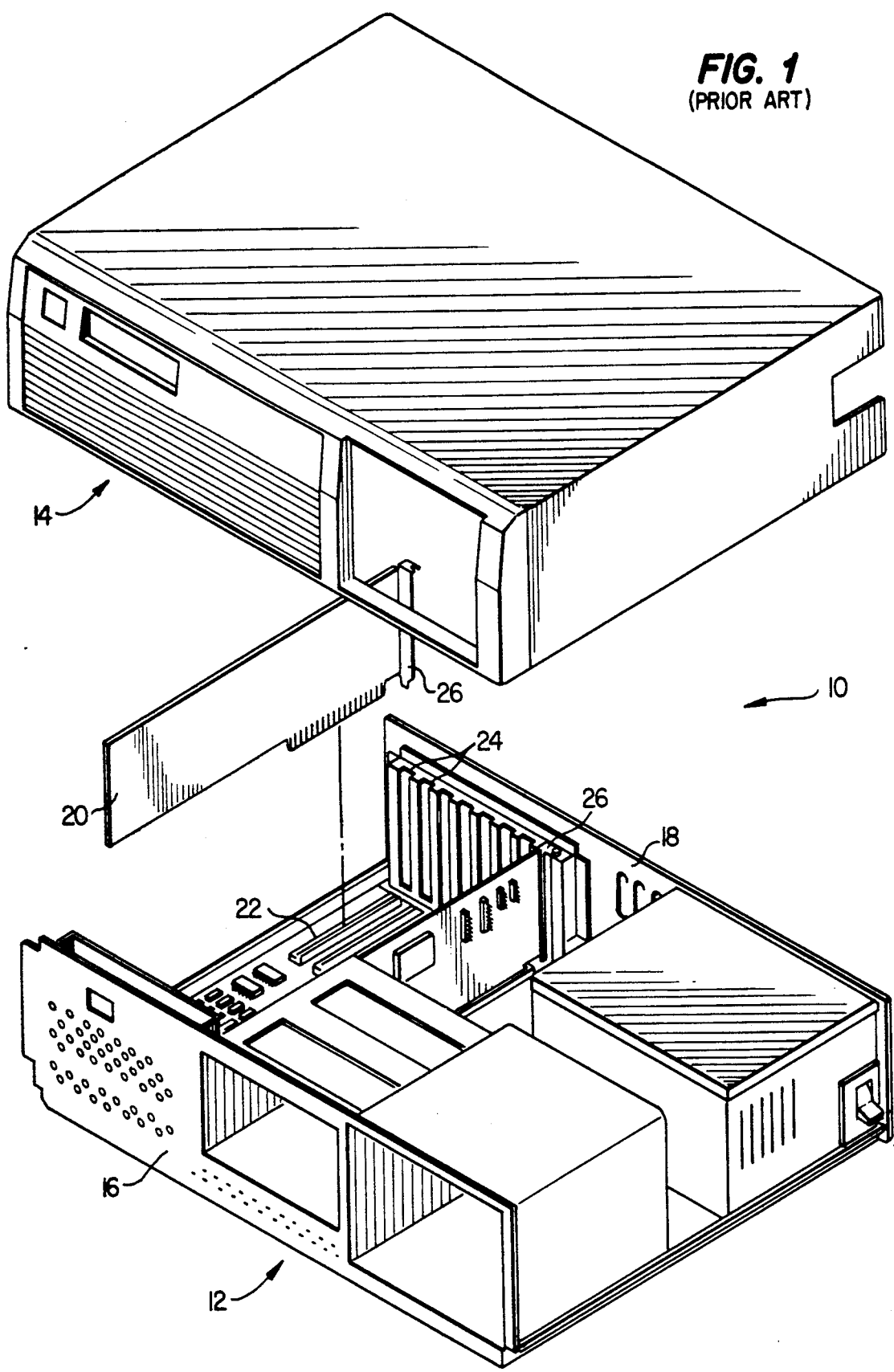
FIG. 1 is an exploded perspective view of a central processing unit constructed in accordance with the prior art.

Referring to FIG. 1, a personal computer central processing unit chassis constructed in accordance with the prior art is generally identified by the reference numeral 10. The chassis 10 comprises a base 12 and a cover 14. The base 12 comprises a metallic frame having a front panel 16 and a rear panel 18. The base 12 holds electronic components, such as a microprocessor, a disk drive (neither shown) and circuit cards 20 which are installed on the base 12 by card holders 22. The cover 14 is positioned over the base 12 to form an enclosed container.

Generally located in the rear panel 18 of the base 12 are a plurality of expansion slots 24. The expansion slots 24 are used to interconnect circuit cards (such as the card 20) with peripheral components such as a printer, a keyboard or a monitor.

Due to the electronic components within the chassis 10, high frequencies are generated, causing radio frequency to be emitted. The radio frequency may escape the chassis 10 through any openings therein. Openings such as expansion slots 24 are an obvious escape route for radio frequency.

In an attempt to reduce the amount of radio frequency escaping from the expansion slots 24, each slot 24 is typically covered by a slot cover 26. Unfortunately, due to the mismatching of the surfaces between the slots 24 and the covers 26, an imperfect closure is formed allowing excessive amounts of RF to escape.

Figure 2:
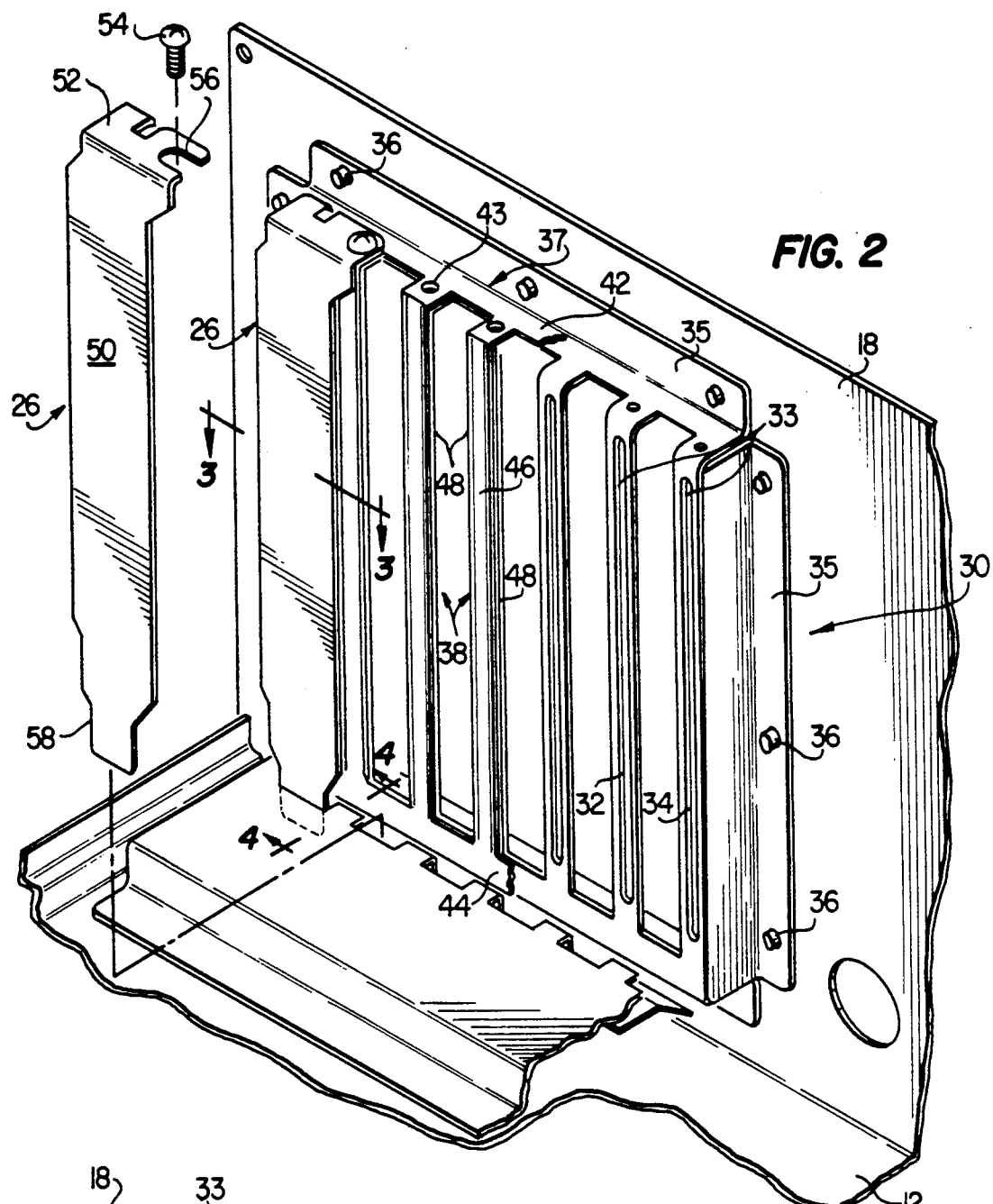
FIG. 2 is a partially exploded perspective view of an expansion slot, expansion slot seal and expansion slot cover in accordance with the preferred embodiment of the present invention.

In FIGS. 2-5, like items are identified by like and similar numerals for ease of reference. Referring to FIG. 2, a partially exploded perspective view of an expansion slot assembly and seal constructed in accordance with the preferred embodiment of the present invention is illustrated. The expansion slots 24 are formed by an expansion slot assembly 30. The expansion slot assembly 30 comprises a plurality of elongate, generally rectangular first strips 32 and spaced apart second strips 34. The first and second strips 32-34 may have a centrally located generally U-shaped groove 33 formed therein to help strengthen the strips. The slots 24 are formed by the gap between the strips 32 and 34 with strips 32-34 forming edges thereof. The assembly 30 is installed onto the rear panel 18 of a CPU by attaching flanges 35 by any appropriate method such as screws or welds (not shown) or rivets 36.

Of primary importance to the present invention is an expansion slot seal 37. The seal 37 is disposed between the first and second strips 32-34 and the slot cover 26. With the addition of the seal 37, the emission of radio frequency through the slots 24 is greatly reduced.

The seal 37 comprises a relatively thin, resilient, metallic substance dimensioned to be secured over the slot assembly 30. The seal 37 comprises a plurality of elongate, generally rectangular spaced apart strips 38. The strips 38 are spaced apart to coincide with the first strips 32 and the second strips 34 of the slot assembly 30. The strips 38 of the seal 37 are interconnected by a first connecting strip 42 and a second connecting strip 44. The first connecting strip 42 is formed generally perpendicular to the spaced-apart strips 38 to allow connection to the slot assembly 30 through a hole 43 and a screw (not shown).

It is preferable to form the seal 37 from a non-corrosive, metallic substance such as, for example, stainless steel. The seal 37 must be an electrical conductor and must have sufficient resiliency or springiness to allow temporary deformation when compressed into sealing contact with the slot assembly 30.

Each strip 38 of the seal 37 has a flat portion 46 and at least one angled portion 48. The flat portion 46 is placed in contact with the first or second strips 32-34 of the slot assembly 30. The angled portion 48 is preferably angled away from the surface of the strips 32-34 for contact with the slot cover 26.

The slot cover 26 comprises an elongate, generally rectangular, relatively stiff metallic strip 50. A connecting portion 52 is formed at an angle to strip 50 to allow connection to the slot assembly 30 by any appropriate method, such as a screw 54 through a hole 56. A tapered portion 58 is formed in distal connecting portion 52 to allow insertion into a retaining device, as will be subsequently described in greater detail.

Figure 3:
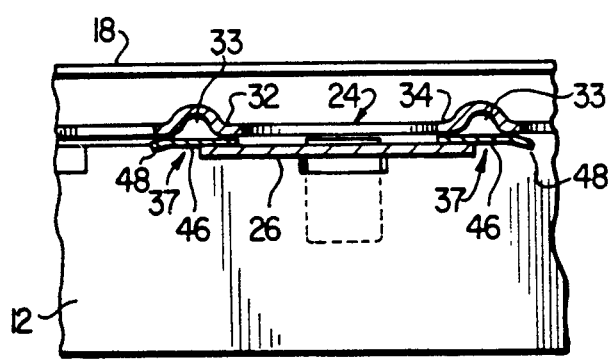
FIG. 3 is a top view along line 3—3 of FIG. 2.

Referring to FIG. 3, a top view along line 3—3 of FIG. 2 is illustrated. A first strip 32 is spaced apart from a second strip 34 to form an expansion slot 24 therebetween. A generally U-Shaped groove 33 is formed along the center of each strip 32-34 to provide added structural strength thereto.

The seal 37 is positioned over each strip 32-34 and held in place by the slot cover 26. The flat portion 46 of the seal 37 is in intimate contact with the strips 32 or 34 while the angled portion 48 is in intimate contact with the cover 26. As the cover 26 is secured into position, the angled portion 48 is compressed to form a tight seal around the slot 24.

Figure 4:
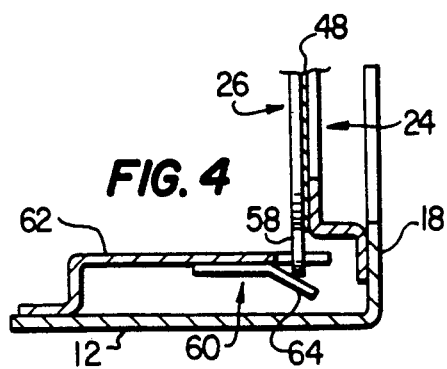
FIG. 4 is a partial cross-sectional view along line 4—4 of FIG. 2 of an expansion slot sealed in accordance with the present invention.

Referring to FIG. 4, a partial cross-sectional view along lines 4—4 of FIG. 2 is shown. The slot assembly 30 is fixed to the rear panel 18 with a slot 24 positioned for future expansion. The slot cover 26 is forced against the seal 37 by a retaining device 60. The retaining device 60 comprises a support piece 62 and a spring steel retainer 64. When the tapered portion 58 of the cover 26 is inserted into the retaining device 60, the retainer 64 forces the cover 26 against the seal 37 and flattens the angled portion 48.

Figure 5:
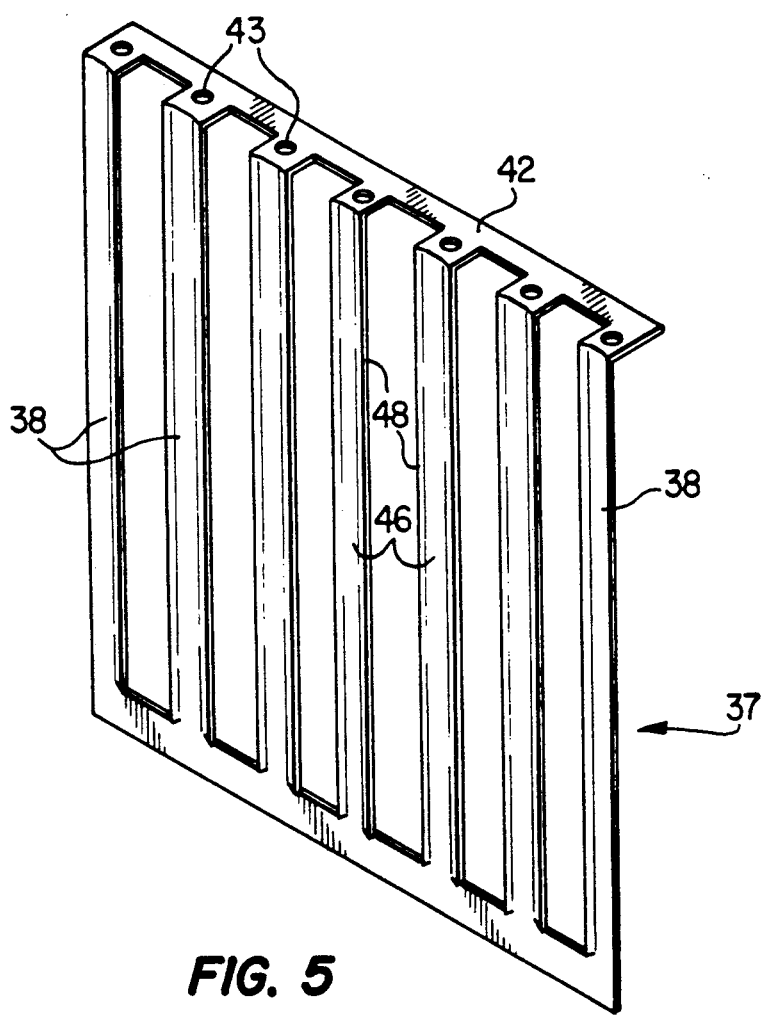
FIG. 5 is a perspective view of the expansion slot seal of the present invention.

Referring to FIG. 5, the expansion slot seal 37 is shown in perspective. As seen in FIG. 5, the seal 37 is a generally rectangular assembly with the first connecting strip 42 formed perpendicular to the strips 38. The strips 38 each have a central flat portion 46 with angled portions 48 extending therefrom. Holes 43 allow attachment of the seal 37 to an expansion slot assembly by screws.

In operation, the slot assembly 30 is installed onto the rear panel 18 of a CPU by any appropriate method, such as rivets 36. A slot seal 37 is then placed over the slot assembly 30 by aligning the strips 38 with the first and second strips 32-34 which form the edges of the slots 24. A slot cover 26 is then positioned over each slot 24 and secured in place with screw 54. As a result of pressure from the retainer 64, the slot cover 26 is forced into the seal 37, which is in-turn forced against the slot assembly 30. The angled portion 48 on the seal 37 is pressed toward the slot assembly 30 and in conjunction with the flat portions 46, seals any spaces that may occur from normal mismatch of materials. Thus, the slot assembly 30 is effectively sealed to inhibit the escape of radio frequency from the chassis 10.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. An apparatus for retarding the escape of radio frequency from an electronic circuit chassis having four walls, said apparatus comprising:

at least one expansion slot for receiving additional electronic circuits, said expansion slot having edges defining a slot opening and adaptable to be affixed to one wall of said chassis;

a slot cover attached to said expansion slot and substantially overlying said slot opening;

sealing means disposed along the edges of said slot opening and between said expansion slot and said slot cover for sealing said slot opening and retarding the escape of radio frequency from said chassis; and a spring-loaded retainer attachable to a chassis wall and engaging the base of said slot cover for forcing said slot cover against said sealing means and said expansion slot.

2. The apparatus of claim 1, wherein said sealing means comprises a resilient electrical conductor.

3. The apparatus of claim 2, wherein said conductor comprises a corrosion-resistant metallic substance.

4. The apparatus of claim 3, wherein said corrosion-resistant substance comprises stainless steel.

5. The apparatus of claim 1, wherein said sealing means comprises:

a flat portion for contact with the edges of said slot opening; and an angled portion for contact with said slot cover.

6. The apparatus of claim 5, wherein said angled portion is angled away from said flat portion toward said slot cover.

7. The apparatus of claim 1, wherein said expansion slot comprises:

at least one first, elongated, generally rectangular metallic strip;

at least one second, elongated, generally rectangular metallic strip spaced apart from said first strip to form said slot opening therebetween.

* * * * *